United States Patent [19]

Eck et al.

[11] Patent Number: 4,885,534

[45] Date of Patent: Dec. 5, 1989

[54] DIRECT MEASUREMENT OF PHOTODIODE IMPEDANCE USING ELECTRON BEAM PROBING

[75] Inventors: Robert E. Eck, Goleta; Richard J. Joyce, Thousand Oaks, both of Calif.

[73] Assignee: Santa Barbara Research Center, Goleta, Calif.

[21] Appl. No.: 244,217

[22] Filed: Sep. 14, 1988

[51] Int. Cl.$^4$ .................... G01R 31/28; G01R 31/26
[52] U.S. Cl. ..................... 324/158 D; 324/158 R; 324/73 R; 250/310; 250/311
[58] Field of Search ............ 324/158 D, 158 R, 73 R, 324/71.3, 77 K; 250/310, 311, 307; 437/8; 136/290

[56] References Cited

U.S. PATENT DOCUMENTS

| | | | |
|---|---|---|---|
| 2,683,794 | 7/1954 | Briggs et al. | 324/158 D |
| 4,695,794 | 9/1987 | Bargett et al. | 324/158 R |
| 4,730,158 | 3/1988 | Kasai et al. | 324/158 D |

Primary Examiner—Reinhard J. Eisenzopf
Assistant Examiner—Vinh P. Nguyen
Attorney, Agent, or Firm—W. C. Schubert; W. K. Denson-Low

[57] ABSTRACT

Photodiode testing apparatus having the capability of directly measuring photodiode impedance. An E-beam machine is used for photodiode testing, the beam being selectively directed to different diodes in an array. A varying level of infrared flux is applied to the photodiode, causing the photodiode to develop ac voltage and current signals which are used for the direct measurement of impedance.

17 Claims, 5 Drawing Sheets

DIRECT MEASUREMENT OF PHOTODIODE IMPEDANCE USING ELECTRON BEAM PROBING

BACKGROUND OF THE INVENTION

1. Field of the Invention

This invention relate to quality control testing of electronic circuitry and, more particularly, to equipment and methods for the non-destructive testing of integrated circuits or other microelectronic devices. This specific application uses a focused electron beam to make current/voltage measurements on photodiode arrays.

2. Description of the Related Art

The development of photodiode arrays comprising large numbers of individual elements is becoming increasingly important in certain specific applications. For quality assurance, it is virtually essential that screening of a fabricated photodiode array on an individual element basis be performed prior to incorporation of the array in utilization equipment. Heretofore, such screening has been performed by mechanical probing of the elements, usually on a single element basis. The results of such a procedure are less than satisfactory. Delicate indium bumps which are provided for circuit test contacts are easily damaged by a contacting probe. The procedure is a very time-consuming operation. A further disadvantage is that the results of the procedure are extremely operator dependent.

Given the nature of the problem—small detector size (approximately 1.5×1.5 mils) of typical multi-element hybrid focal plane arrays and the delicate character of the indium interconnects—some type of non-contacting method of diode probing is desired, preferably one which can be automated or at least performed in a way which provides results which are independent of operator parameters.

A system has been developed which uses an electron beam integrated circuit tester for testing the internal nodes of a complex integrated circuit. This system incorporates electron beam apparatus which focuses and directs the electron beam to selected internal nodes and detects secondary electron emission therefrom with associated computerized control circuitry. As thus controlled, the electron beam apparatus provides high speed access and testing of the integrated circuit nodes.

In one version of the system, the probe intelligently chooses a limited number of the internal nodes which are considered most likely to indicate circuit failure so as to minimize the number of nodes tested while maximizing reliability of the results. The probe comprises an artificial intelligence which understands the design and operation of the integrated circuit under test, the intelligence being embodied in a programmed computer associated with the probe. The system further includes circuitry for accessing the peripheral pads of the integrated circuit under test and for applying the proper circuit biases, clock signals and test signals under control of the computer. In such a system, the movement of the electron beam between selected internal nodes of the circuit and the operation of the associated computer to select those nodes are decisions which may be made in a matter of microseconds or milliseconds.

The electron beam of the test apparatus, when focused on a single selected node within the circuit, creates secondary electron emission having a flux which is affected by the properties of the node on which the electrons of the primary beam impinge. A suitable detector responds to the secondary emission electron flux, permitting the computer to sense and store the voltage of the node under test.

A particular advantage of such a system is that the probe does not capacitively load any of the internal nodes of the integrated circuit under test, nor does it damage them. At the same time, the electron beam of the probe has a submicrometer diameter and is easy to position with great precision. Because of the high speed with which the nodes may be selected and tested, use of the system on a production line having high product through-put is cost effective and is inherently more reliable than the conventional testing methods outlined hereinabove.

E-beam testing of individual photodiodes in a photodiode array has also been accomplished. Instead of directing the electron beam to internal circuit nodes, as described above, the beam is used to access the free electrode of a selected diode in the array. These arrays comprise individual photodiodes, one electrode of which is connected to a common ground or reference plane. The other electrodes are individually coupled to corresponding indium bumps which complete the circuit to the associated photodiodes when the diode array is mounted in utilizing apparatus. These other electrodes are also wire bonded in selected groups to an external pin connection.

In testing the photodiode array, the electron beam is deflected to the selected diode, developing a predetermined voltage thereon. The corresponding current of the diode is measured by an electrometer coupled in the circuit path to the common diode substrate reference plane. Various diode voltage levels are established by controllably varying the duty cycle of the pulsed E-beam and are measured by an associated voltage contrast sensor comprising a scintillator which responds to secondary emission electron flux from the particular diode under test. The particular I-V measurements developed in the manner described are compared with corresponding I-V plots of similar diodes of known quality characteristics, utilized as a reference, to determine if the diode under test is acceptable or not.

The reliability of the I-V measurements developed in this manner depends upon an assumption that the quality characteristics of the diode under test do not differ materially from those of the diode used as a reference. This is intended to be a reasonable assumption, since the diode used as a reference will be one which is located on the same wafer as the diode array under test, thus presumably having been fabricated under the same conditions. It does not always work out that way, however. Sometimes, for reasons which are not fully understood, there may be substantial variations in the operating parameters and characteristics of different diodes on the same wafer.

Additionally, the I-V measurements depend upon an indirect calibration of the voltage contrast sensor. The voltage levels measured by the voltage contrast sensor require resort to a look-up table, derived from an indirect calibration of the voltage contrast sensor, to determine the voltage levels of the I-V measurements taken for the diode undergoing test.

It would be preferable to calibrate the voltage contrast sensor from the actual diode under test. However, the typical low background curve for the test diode does not admit of precise determinations of the true values for different voltage levels. It would be desirable to be able to calibrate the voltage contrast sensor for an individual diode by measuring the zero-current crossings of the voltage axis with increased precision, sufficient to make the calibration reliable.

U.S. Pat. No. 4,730,158 of Kasai et al discloses apparatus using an electron beam for the testing of photodiode arrays. Samples of current are recorded as the diodes are charged at successive intervals over an RC time constant curve to develop successively increasing voltages with time. Diode voltage and current are measured at the end of each interval and the resulting data are used to develop a current-voltage characteristic for each diode. During the scanning procedure, the E-beam is stepped along rows of diodes to rapidly develop the data for all of the diodes in an array. By analysis of the I.V. curves of the respective diodes in an array, detection of defective or sub-standard diodes is facilitated. There is no direct physical contact with the photodiodes; thus the array is not affected by the test procedure. The disclosure of patent No. 4,730,158 is incorporated herein by reference.

Another patent of interest is No. 4,695,794 of Bargett et al which discloses the calibration of equipment being used for testing photodiode arrays by reference to the diode under test. The diodes are illuminated with infrared radiation and different bias voltages, developed by bombardment with an electron beam, are measured at zero current. The measured voltage values are correlated with secondary emission sensor readouts to calibrate the sensor according to the specific diode being tested. As with the previously described systems, an E-beam probe is used which permits testing of the photodiode arrays without direct physical contact of the photodiodes. The E-beam is chopped with varying duty cycles so that a succession of calibration voltage levels are derived which are used to relate the voltage contrast sensor output for a given diode with the actual voltage measurements. This calibrated output is then referenced directly in measuring diode voltage while taking corresponding current measurements for the I.V. curve data which is needed as the diode test results. The disclosure of patent No. 4,695,794 is incorporated herein by reference.

SUMMARY OF THE INVENTION

In brief, arrangements in accordance with the present enable an E-beam test machine of the type described hereinabove to provide an ac drive capability for the infrared source and an ac detection capability in the voltage detection portion of the system. Use of these capabilities permits the direct measurement of the impedance of the diode under test. By making direct measurements of diode impedance in the manner afforded by the present invention, problems and inaccuracies of result encountered in the use of the prior systems in the presence of dc drift such as may be caused by ice or other contamination on the test article or on parts of the E-beam machine are avoided.

Arrangements in accordance with the present invention apply a calibrated ac infrared flux to induce ac changes in the current-voltage relationship of the photodiodes under test. This results in an ac voltage being developed on the photodiode that is being measured. The ac voltage is a direct result of a constant current induced by the electron beam and the ac changes in the diode current-voltage relationship. Photodiode impedance is then directly calculated from the measurements of ac voltage on the photodiode, the ac flux drive, and the calibration coefficients for each measurement. Direct impedance measurement in this manner obviates the need for the I-V characteristic curve that is the basis of impedance determination in the prior art E-beam systems discussed hereinabove.

Particular arrangements in accordance with the present invention employ a relatively low frequency (approximately 10 hertz) ac modulation of the infrared source of the E-beam machine. The electron beam is stepped along the photodiode array, using approximately one second per detector. A calibration is made of the alternating infrared flux to obtain an equivalent $\Delta I$ value for the offset in the diode current-voltage relationship. Thus, the impedance can be determined directly from the measurement of $\Delta V$ and the derived $\Delta I$.

In one particular arrangement of the invention, impedance measurements are made without autogain on the voltage contrast sensor. In another, alternative, arrangement, a feedback signal is applied by an ac generator coupled to drive the photodiode array. The frequency of the resulting autogain drive is above the response band of the photodiodes and the photodiode array voltage is constant across the array. This autogain provides stabilization of the voltage contrast detector, thus further compensating for basic E-beam machine characteristics, dc drift and the like.

BRIEF DESCRIPTION OF THE DRAWING

A better understanding of the present invention may be realized from a consideration of the following detailed description, taken in conjunction with the accompanying drawing in which.

DESCRIPTION OF THE PREFERRED EMBODIMENTS

Figure 1:
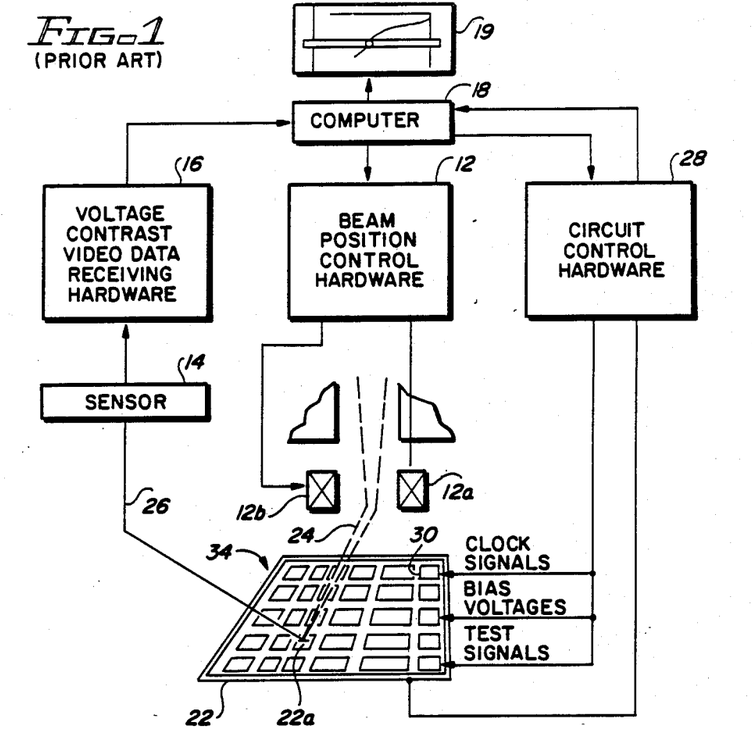
FIG. 1 is a schematic block diagram of a particular E-beam system of the prior art for testing photodiode arrays.
Figure 2:
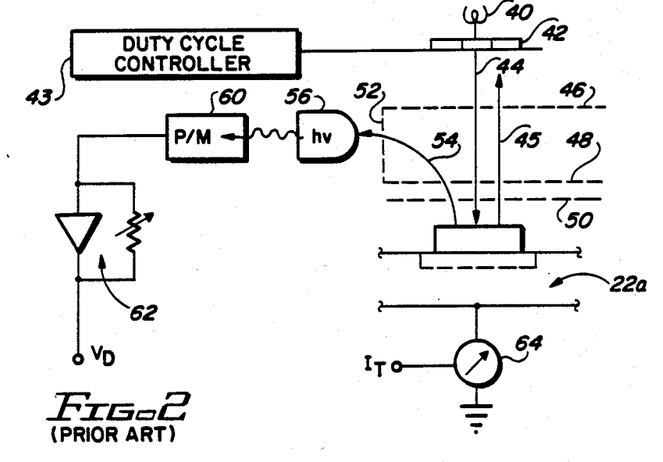
FIG. 2 is a schematic diagram illustrating the details of operation of a portion of the system of FIG. 1.

The schematic block diagrams of FIGS. 1 and 2 are taken from patent No. 4,730,158 as an example of a prior art system for E-beam testing of photodiode arrays. By way of explanation of FIG. 1 an electron beam generator 10 is shown in association with beam position control hardware 12 which includes deflection coils 12a and 12b, together with a secondary electron emission sensor 14 and associated voltage contrast video data receiving hardware 16. A computer 18 is coupled to control the beam position hardware 12 and the voltage contrast hardware 16. A plotter 19 is coupled to the computer 18 as an output device. The correlated data is processed by the computer 18 which controls the plotter 19 to produce the I-V curve for the photodiode under test.

An electron beam 24 from the beam generator 10 is directed toward the array 22, applied instantaneously to a single photodiode 22a thereof, to create secondary electron emission 26 which is received at the detector 14. The array 22 is activated by means of circuit control hardware 28, also controlled by the computer 8. The circuit control hardware 28 generates clock signals, test signals and bias voltages which are applied to appropriate paths 30 along the periphery of the array 22 to complete the test circuit paths and also measures individual diode current for inputting to the computer 18 where it is correlated with corresponding diode voltage data from the voltage contrast hardware 16.

The computer 18 selects a particular diode 22a to be tested and directs the circuit bias input signal hardware 28 to apply appropriate clock signals, bias voltages and test signals to the appropriate ones of the paths 30; it also causes the beam position control hardware to direct the electron beam 24 to focus on the particular selected diode 22a. Secondary electrons are emitted from the diode 22a and are detected by the sensor 14 which generates an output voltage proportional to the diode voltage. This voltage is determined by monitoring the secondary electron energy distribution of the emitted secondary electrons 26. The receiving hardware 16 converts the voltage signal from the sensor 14 to a number corresponding to the actual voltage of the photodiode 22a and supplies this data to the computer 18. At the same time, the circuit control hardware 28 measures the current to the diode 22a under test and also supplies this data to the computer 18.

FIG. 2 illustrates further details of the procedure used in testing a single photodiode 22a. In FIG. 2, an electron source 40 is shown associated with a chopper 42 which includes a duty cycle controller 43 for modulating the incident electron beam, represented by the arrow 44. Broken lines 46, 48 and 50 represent a trap grid, an analyzer grid and an extraction grid, respectively. A collection grid 52 directs the secondary emission electrons, represented by the curved arrow 54, to a scintillator 56 where they are converted to photons. Photons from the scintillator 56 trigger a photomultiplier 60 and the resultant electrical signal is amplified by a head amplifier 62 to develop the voltage contrast sensor output. Concurrently, a diode sample current $I_{SUB}$ is measured by a measuring device 64 in the circuit control hardware 28 (FIG. 1). The arrangement of FIG. 2 illustrates the means by which the secondary electrons are selected by the voltage contrast sensor. The extraction grid 50 overwhelms the localized field of the target and pulls off the secondary electrons while the analyzer grid 48 analyzes the energy distribution of the emitted secondary electrons. The trap grid 46 and collection grid 52 direct the secondary electrons into the scintillator 56 without appreciably affecting the primary beam, while allowing the backscattered electrons (indicated by the arrow 45) to travel back toward the E-beam column final lens.

In the test procedure, the E-beam acts as a current source to each diode under test. Diode bias voltages are sensed by measuring the secondary electron emission energy distribution and converting this information into a voltage reading. Sample diode currents are externally measured to complete the I-V data. The sample diode current $I_{SUB}$ measured at 64, is equal to the difference between the primary electron beam current $I_p(44)$ and the secondary and backscatter electron currents $I_S(54)$ and $I_B(45)$.

Figure 3:
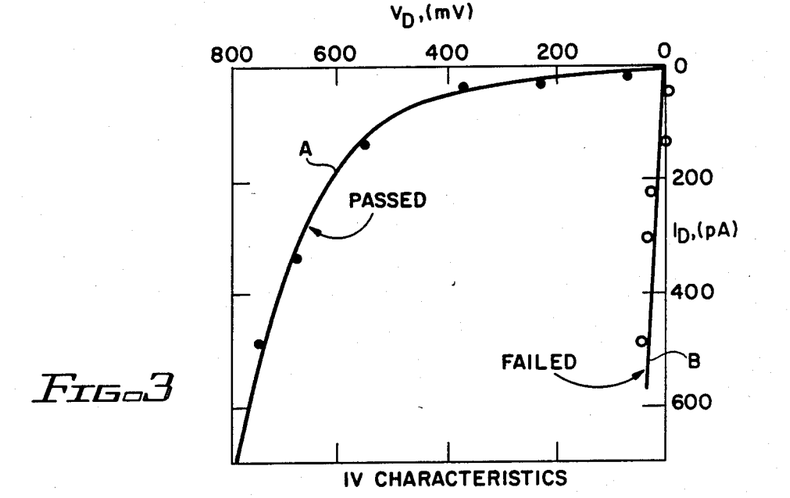
FIG. 3 is a graph of I-V characteristics for typical photodiodes as tested in the system of FIGS. 1 and 2.

FIG. 3 is an idealized curve showing the I-V characteristic curves for photodiodes such as those tested by the system of FIGS. 1 and 2. In the graph of FIG. 3, diode voltage $V_D$, in millivolts, is measured along a horizontal axis, while diode current $I_D$, in pica-amperes ($10^{-12}$ amperes) is taken along the vertical axis. Curve A represents the I-V characteristic curve for a diode which is found to be acceptable, whereas curve B represents the I-V characteristic curve of a diode that is unacceptable. Thus, the prior art systems provide for the quality control testing of the photodiode arrays by sampling the diodes in succession to develop the points from which the I-V characteristic curve can be determined. Testing in this manner requires a certain amount of time, since point by point sampling is necessary to derive the various points from which the characteristics are derived. Moreover, because this testing is performed on a dc basis, the test results suffer from inaccuracies which may be introduced by a dc drift, such as may be caused by the buildup of surface charge, the formation of ice on elements in the E-beam control structure, and other factors. Arrangements in accordance with the present invention determine the diode resistance from the measurement of ac voltages and currents, thereby avoiding the undesirable effects of dc drift. Also, arrangements in accordance with the present invention make the ac measurements in an operating point range above the range where low frequency noise is a problem.

Figure 4:
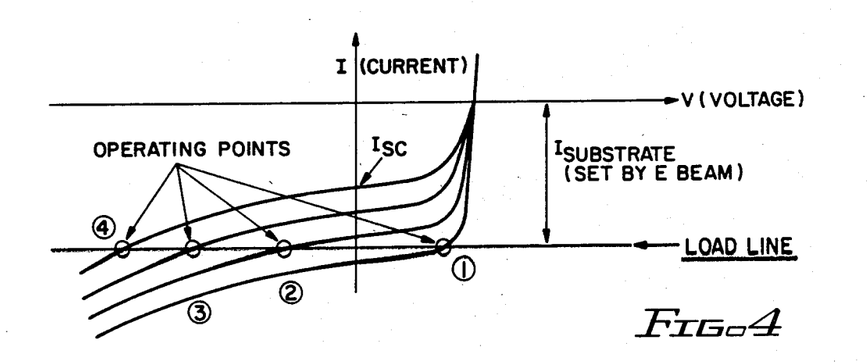
FIG. 4 is a graph of operating curves for photodiodes under different IR flux operating conditions.
Figure 5:
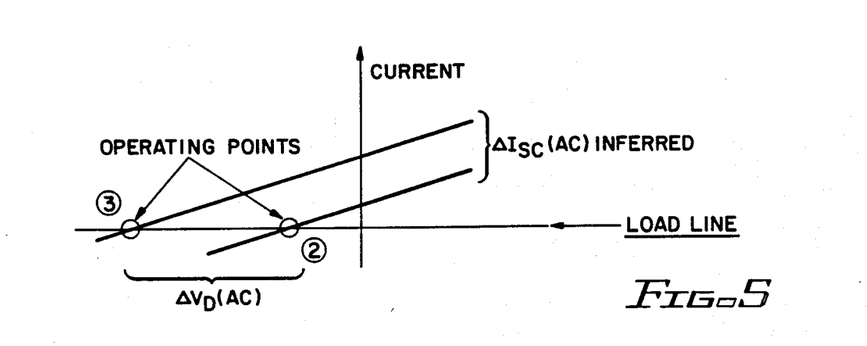
FIG. 5 is a graph of a portion of FIG. 4 illustrating the ac measurements from which diode impedance may be measured in accordance with the present invention.

FIGS. 4 and 5 are graphs of waveforms showing the operating characteristics of a photodiode such as those undergoing testing in arrangements in accordance with the invention. In these figures (FIG. 5 being an expansion of a portion of FIG. 4), current-voltage operating characteristic curves are presented for different levels of infrared flux. A loadline which is parallel to the zero current axis of the graph is established by the value of substrate current $I_{SUB}$ which is determined by the E-beam. Where the loadline passes through the different characteristic curves, operating points 1 through 4 are established. The short circuit current, $I_{SC}$, occurs at the point where the respective characteristic curves pass through the zero voltage point.

FIG. 5 shows the determination of $\Delta V_D$, the voltage difference along the load line between operating points 2 and 3, and the corresponding $\Delta I_{SC}$, the difference in the short circuit values corresponding to operating points 2 and 3. From the development of these two ac parameters, diode impedance can be directly determined through the application of Ohm's Law.

In diode testing in this manner, the electron beam and secondary emission determine the net diode current, $I_{SUB}$. Diode voltage $V_D$ is determined by the diode I-V characteristics and $I_{SUB}$. For example, diode voltage is the open circuit voltage ($V_{OCV}$) when diode current is zero or negligible. Diode I-V short circuit current ($I_{SC}$) can be used to parameterize the relationship between the I-V characteristics and $I_{SUB}$. Thus, $$V_D = V_{OCV} \text{ when } I_{SUB} << I_{SC}$$

$V_D = 0$ when $I_{SUB} > I_{SC}$
$V_D < 0$ when $I_{SUB} > I_{SC}$
Varying the incident flux varies $I_{SC}$ in accordance with the following relationship:

$$I_{SC} = \eta Ae(F_{LED} + Q_B)$$

where $\eta$ represents the quantum efficiency, A is the area, e is a conversion constant, $F_{LED}$ is the IR LED photon flux, and $Q_B$ is the IR background photon flux; and consequently varies the diode voltage for constant $I_{SUB}$.

Figure 6:
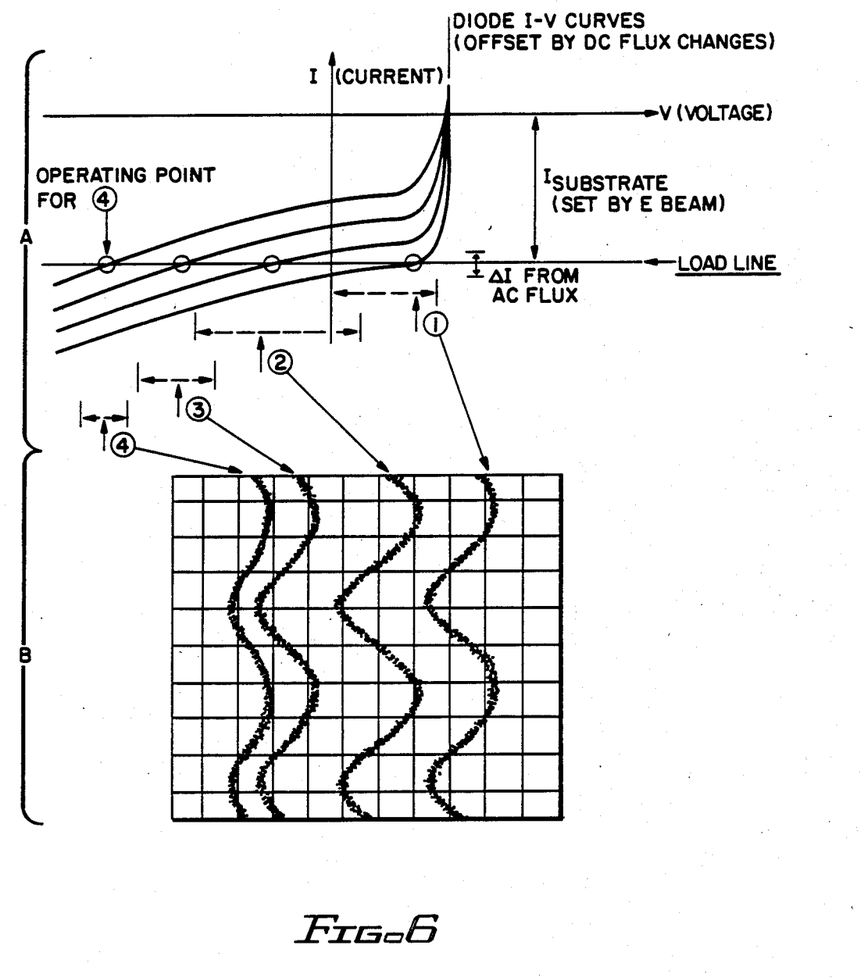
FIGS. 6A and 6B are, respectively, a graph illustrating different operating points along a diode load line and the related waveforms as displayed on an oscilloscope for various operating points along the load line of FIG. 6A.

FIG. 6 illustrates the differing results which are obtained as an output of the photodiode testing apparatus from different operating points along the loadline. FIG. 6A is essentially a reproduction of FIG. 4 with the addition of the respective ac voltage swings indicated by the broken horizontal lines and vertical terminator lines for the respective operating points 1-4. In this graph, the ΔI resulting from the ac flux is constant. The voltage at the loadline for each of the different operating points is set by a dc flux level. Applying a dc flux level shifts the operation of the device into a more favorable range.

FIG. 6B is a display showing the variation in diode voltage as measured by the voltage contrast detector for the ac voltage swings of the respective operating points 1-4 of FIG. 6A. For purposes of this representation, the waveform display of FIG. 6B is rotated 90 degrees from its conventional orientation so that the time baseline is along the left-hand edge of the figure. It will be noted that the waveform for operating point No. 1 is very non-linear and that the ac voltage decreases from operating point 2 through points 3 and 4 consistent with a decrease in diode impedance. In FIG. 6, for operating point No. 2, resistivity is measured at $2.5 \times 10^5$ ohm-cm$^2$, dc flux equals $2.4 \times 10^{14}$ photon/cm$^2$/sec, and the ac flux equals $1.7 \times 10^{13}$.

Figure 7:
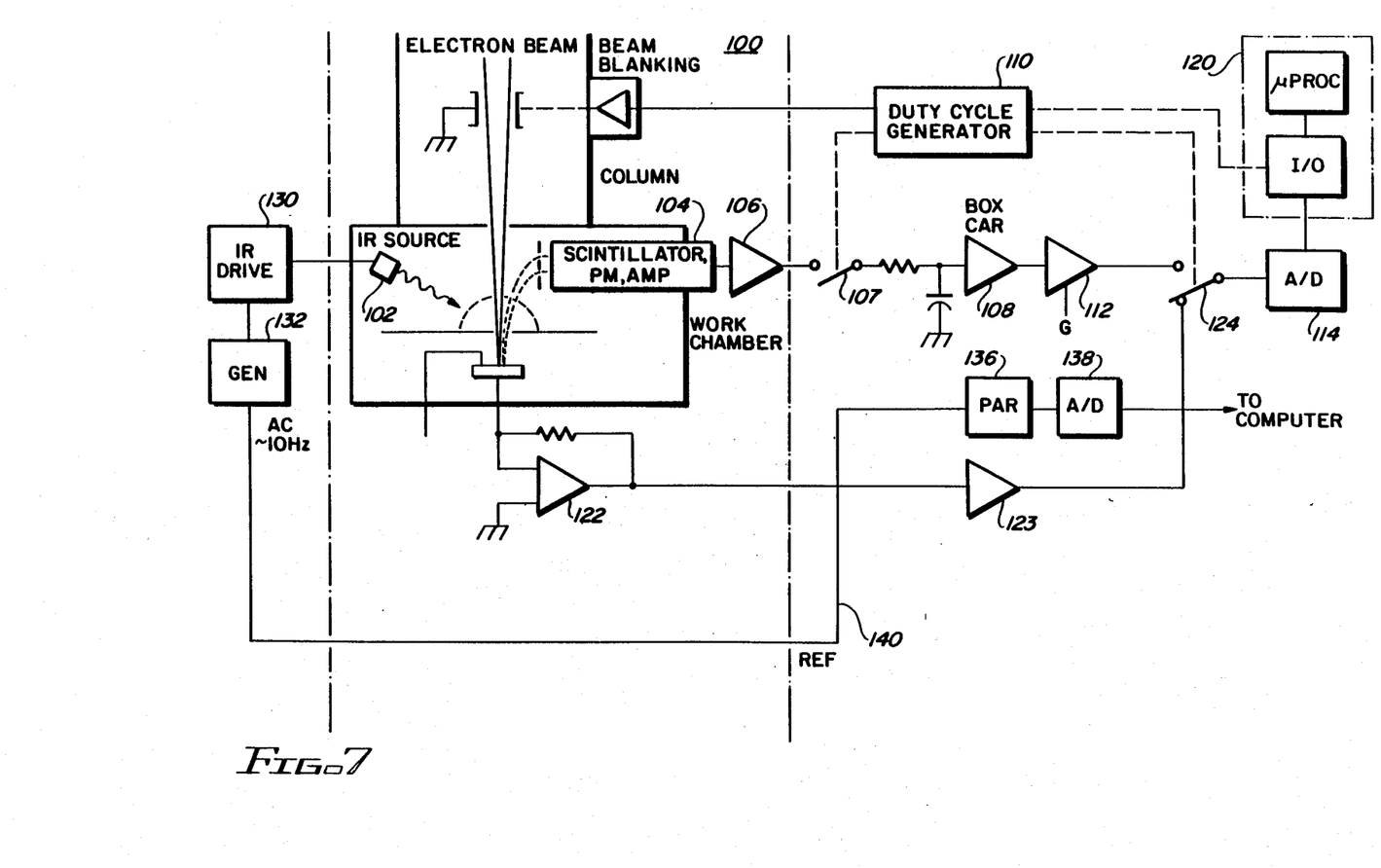
FIG. 7 is a schematic block diagram of one particular arrangement in accordance with the present invention for making direct impedance measurements of photodiodes under test.

FIG. 7 is a schematic block diagram representing one particular embodiment of the present invention. The E-beam apparatus 100 shown in FIG. 7 between the two vertical dot-dash lines essentially corresponds to the apparatus of FIG. 1 with the addition of an infrared source 102, which is part of the above-referenced patent No. 4,695,794. As in FIG. 1, a duty cycle generator 110 is controlled by a computer 120 to effect the blanking of the E-beam. The output from the sensor 104, shown in FIG. 7 as comprising a scintillator, photomultiplier and amplifier, is coupled to a further amplifier 106 and then applied to a boxcar integrator 108, a further amplifier 112 and an analog to digital (A/D) converter 114 when switch 124 is in the voltage measuring position. The output of the A/D converter 114 is then applied to the computer 120. The circuit path between the amplifier 106 and integrator 108 is controlled in synchronism with beam blanking via a coupling to the duty cycle generator 110. Amplifier 122 converts the substrate current to a proportional voltage and applies this voltage to the A/D converter 114 through a second amplifier 123 when switch 124 is in the current measuring position. The voltage signal from the sensor channel and the substrate current are thus multiplexed by switch 124 and sampled by the A/D converter 114 whose output is then passed to the computer 120.

The infrared source 102 is driven by an IR drive stage 130 which receives its input control signal from an ac generator 132. This generator 132 provides an alternating signal at a low frequency from 10 to 40 hertz, preferably 10 hertz. This develops the ac IR flux which in turn develops the diode alternating voltage about the selected operating point, as indicated in FIGS. 4-6, so that ac voltage and current measurements are developed to provide for the direct measurement of diode impedance by the computer.

A phase sensitive amplifier 136, locked to a reference signal 140, and additional A/D converter 138 provide the computer 120 with a measure of the average value of the ac voltage signal at the output of the boxcar integrator 108.

Figure 8:
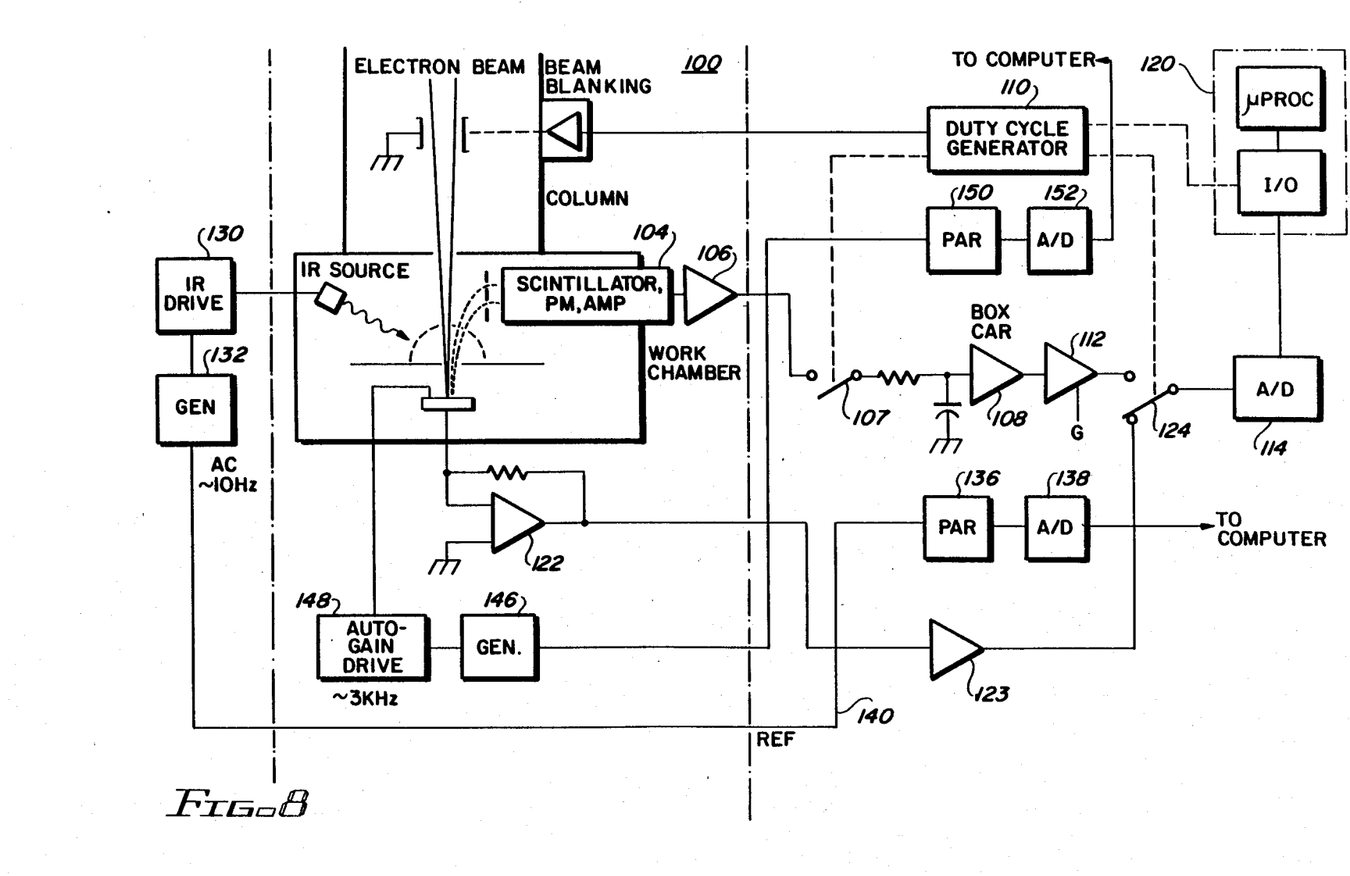
FIG. 8 is a schematic block diagram of an alternative arrangement for making direct impedance measurements of photodiodes under test.

FIG. 8 is a schematic block diagram like that of FIG. 7, except that additional circuitry is included to provide autogain feedback for the stabilization of the voltage contrast detector. Corresponding elements in FIG. 8 have been given like reference numerals to those of FIG. 7. The addition to the system of FIG. 7 to achieve the autogain feature comprises a generator 146 coupled to an autogain drive stage 148 which is connected to the photodiode array in the E-beam machine. This develops an ac signal at a frequency which is above the upper limit of the photodiode response band so that the impedance of the photodiode as determined by the ac voltage and ac current measurements is not affected by the autogain feature. The generator 146 also provides a reference signal to an additional phase sensitive amplifier 150 coupled to provide a signal via an A/D converter 152 to the computer which is a representation of the signal level at the output side of switch 107 which is coherent with the reference signal from the generator 146. The beneficial result of utilizing the autogain feature included in the circuit of FIG. 8 is to change the voltage contrast detector response within its operating range in order to compensate for dc drift or other aberrative effects which may be due to particular E-beam machine structure or other factors.

Although there have been shown and described hereinabove specific arrangements for the direct measurement of photodiode impedance using electron beam probing in accordance with the invention for the purpose of illustrating the manner in which the invention may be used to advantage, it will be appreciated that the invention is not limited thereto. Accordingly, any and all modifications, variations, or equivalent arrangements which may occur to those skilled in the art should be considered to be within the scope of the invention as defined in the annexed claims.

What is claimed is:

1. Photodiode testing apparatus comprising:
   electron-beam source means for generating a beam of primary electrons;
   beam control means for directing the beam to a selected diode in a photodiode array;
   infrared source means for applying a selected level of infrared flux to said photodiode;
   means responsive to a selected alternating signal for varying the infrared flux level at a predetermined frequency and amplitude; and
   means for measuring the ac voltage at the photodiode produced by said variation of infrared flux level;
   wherein the impedance of the photodiode is directly determined from said measurements of alternating voltage and alternating infrared flux level.

2. The apparatus of claim 1 further including means for establishing a selected operating point for a diode under test and ac generating means for varying the voltage about said selected operating point by controlling the means for varying the incident infrared flux level in an ac manner.

3. The apparatus of claim 2 wherein said establishing means includes means for applying a selected level of infrared flux as a background bias to shift the selected operating point to a region of increased linearity.

4. The apparatus of claim 1 wherein the beam control means further includes means for cyclically blanking the E-beam to provide measurement of diode current at essentially zero diode voltage.

5. The apparatus of claim 4 wherein said blanking means comprise a duty cycle generator coupled to selectively direct voltage and current signals from a diode under test to said measuring means.

6. The apparatus of claim 5 further including circuit path switching means responsive to said duty cycle generator for alternatively coupling the respective voltage and current signals to an output signal processor.

7. The apparatus of claim 1 wherein said predetermined frequency of flux level variation is in a range of about 10 to about 40 hertz.

8. The apparatus of claim 7 wherein said predetermined frequency is approximately 10 hertz.

9. The apparatus of claim 1 wherein said flux level varying means comprise a low frequency ac generator coupled to an infrared source drive stage.

10. The apparatus of claim 1 wherein said last-mentioned means comprise a computer for making photodiode impedance determinations from applied ac infrared flux and an ac voltage signal derived from the photodiode.

11. The apparatus of claim 1 further including an autogain drive stage coupled to said photodiode array to apply a feedback signal derived from the processing of ac voltage signals from the photodiode.

12. The apparatus of claim 11 wherein said last-mentioned means comprise means for generating an alternating signal at a frequency above the upper limit of the response band of the photodiode under test.

13. The method of using electron-beam apparatus for testing selected photodiodes in a photodiode array comprising the steps of:
   directing the electron beam to a selected diode in the array;
   applying infrared flux to said photodiode;
   cyclically varying the level of applied infrared flux at a predetermined frequency and amplitude to cause said photodiode to develop alternating voltage and current signals;
   measuring said alternating voltage signals; and
   directly determining the impedance of the photodiode under test from measurements of said signals.

14. The method of claim 13 wherein the step of varying the infrared flux level comprises varying the flux at a frequency in the range from about 10 to 40 hertz.

15. The method of claim 14 wherein said frequency is about 10 hertz.

16. The method of claim 13 further including the steps of respectively measuring ac voltage of the photodiode and alternating substrate current thereof for the determination of photodiode impedance.

17. The method of claim 16 further including the step of alternately applying an ac voltage signal and an alternating current signal derived from the photodiode under test to signal processing means for determining photodiode impedance.

* * * * *